United States Patent [19]
McKee et al.

[11] Patent Number: 6,103,008
[45] Date of Patent: *Aug. 15, 2000

[54] SILICON-INTEGRATED THIN-FILM STRUCTURE FOR ELECTRO-OPTIC APPLICATIONS

[75] Inventors: Rodney A. McKee, Kingston; Frederick Joseph Walker, Oak Ridge, both of Tenn.

[73] Assignee: UT-Battelle, LLC, Oak Ridge, Tenn.

[*] Notice: This patent is subject to a terminal disclaimer.

[21] Appl. No.: 09/126,129

[22] Filed: Jul. 30, 1998

[51] Int. Cl.[7] .................................................. C30B 33/04
[52] U.S. Cl. ........................ 117/2; 117/3; 117/4; 423/593
[58] Field of Search ........................ 117/2, 3, 4; 423/593

[56] References Cited

U.S. PATENT DOCUMENTS

| | | | |
|---|---|---|---|
| 5,058,250 | 10/1991 | Turnbull | 29/25.35 |
| 5,225,031 | 7/1993 | McKee et al. | |
| 5,295,218 | 3/1994 | Agostinelli et al. | 358/122 |
| 5,450,812 | 9/1995 | McKee et al. | |
| 5,576,879 | 11/1996 | Nashimoto | 359/248 |
| 5,654,229 | 8/1997 | Leplingard et al. | 117/56 |
| 5,666,305 | 9/1997 | Mihara et al. | 365/145 |
| 5,830,270 | 11/1998 | McKee et al. | 117/106 |

OTHER PUBLICATIONS

Wu et al., "Domain structure and polarization reversal in films of ferroelectric bismuth titanate", Ferroelectrics vol. 3 pp. 217–224, 1972.

*Primary Examiner*—Robert Kunemund
*Attorney, Agent, or Firm*—Michael E. McKee; George L. Craig; Joseph A. Marasco

[57] ABSTRACT

A crystalline thin-film structure suited for use in any of an number of electro-optic applications, such as a phase modulator or a component of an interferometer, includes a semiconductor substrate of silicon and a ferroelectric, optically-clear thin film of the perovskite $BaTiO_3$ overlying the surface of the silicon substrate. The $BaTiO_3$ thin film is characterized in that substantially all of the dipole moments associated with the ferroelectric film are arranged substantially parallel to the surface of the substrate to enhance the electro-optic qualities of the film.

15 Claims, 2 Drawing Sheets

1 …
SILICON-INTEGRATED THIN-FILM STRUCTURE FOR ELECTRO-OPTIC APPLICATIONS

This invention was made with Government support under Contract No. DE-AC05-96OR22464 awarded by the U.S. Department of Energy to Lockheed Martin Energy Research Coporation, and the Government has certain rights in the invention.

BACKGROUND OF THE INVENTION

This invention relates generally to structures involving the growth of epitaxial thin-films upon semiconductor-based materials and relates, more particularly, to such structures having thin films grown thereon which possess desirable optical properties.

It is known that a thin-film layer of a ferroelectric material, such as $BaTiO_3$, can be grown directly upon a semiconductor-based material, such as silicon, to render a monolithic structure which possesses both semiconductor and ferroelectric properties. For example, applicants have described the growth of such a material in their co-pending application Ser. No. 08/692,343, filed Aug. 5, 1996, wherein the build up of the ferroelectric material is effected one-plane-at-a-time wherein each plane contains one of two selected constituent metal oxide planes of the crystalline form of the ferroelectric material.

Heretofore, however, there does not exist a structure which incorporates a ferroelectric material and a silicon substrate and which has been used as an active waveguide material in a silicon-based communication system. It would be desirable, therefore, to provide a monolithic structure which incorporates a ferroelectric oxide and silicon wherein the ferroelectric material is capable for use as an active waveguide material.

It is an object of the present invention to provide a structure involving the growth of a ferroelectric thin-film upon a semiconductor-based material, such as silicon, wherein the thin-film possesses highly desirable electro-optical characteristics.

Another object of the present invention is to provide such a structure wherein the crystalline growth of the thin-film advantageously affects the optical characteristics of the thin-film.

Still another object of the present invention is to provide such a structure which includes a material having the general formula $ABO_3$ such as, by way of example and not as limitation, a perovskite, and in particular a perovskite in the $BaTiO_3$ class, grown upon materials selected from the Group III–V, IV or II–VI classes of materials including, by way of example and not as limitation, a silicon or silicon-germanium substrate.

Yet another object of the present invention is to provide such a structure which can be used as a solid state electrical component, such as a phase modulator or switch, of an electro-optic device, such as an interferometer.

Yet still another object of the present invention is to provide such a structure having a semiconductor-based substrate and a perovskite thin-film overlying the substrate wherein the substrate of the structure is utilized in the transmission of electricity and wherein the thin-film is utilized for the transmission of light.

One more object of the present invention is to provide such a structure for use as a building block of a communication system through which both electricity and light are transmitted.

SUMMARY OF THE INVENTION

This invention resides in a crystalline structure involving a ferroelectric thin film disposed atop a semiconductor surface wherein the orientation of the crystals within the thin film advantageously effects the electro-optic characteristics of the thin film.

The structure includes a semiconductor substrate having a surface, and further includes a ferroelectric thin film overlying the surface of the substrate wherein substantially all of the dipole moments associated with the ferroelectric film are arranged substantially parallel to the surface of the substrate.

DETAILED DESCRIPTION OF AN ILLUSTRATIVE EMBODIMENT

Figure 1:
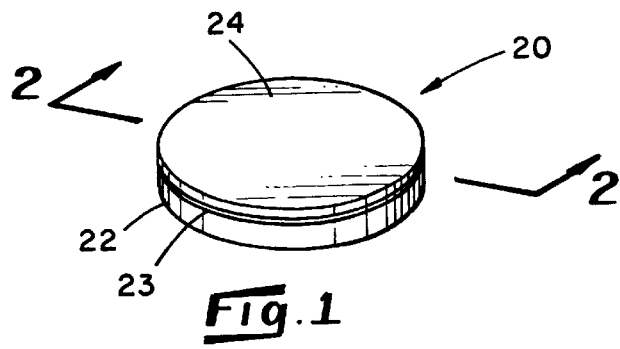
FIG. 1 is a schematic perspective view of a fragment of a silicon wafer upon which a film of $BaTiO_3$ is constructed for use in a waveguide structure.
Figure 2:
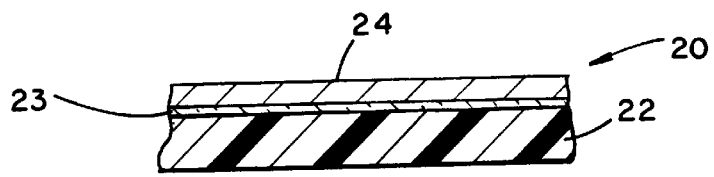
FIG. 2 is transverse cross-sectional view of the FIG. 1 wafer taken about line 2—2 of FIG. 1.

Turning now to t he drawings in greater detail, there is shown in FIGS. 1 and 2 a monolithic crystalline structure, generally indicated 20, comprised of a substrate 22 of silicon, an intermediate thin film layer 23 of magnesium oxide (MgO) and a thin film layer 24 of the perovskite $BaTiO_3$ overlying the MgO layer 23. Both the MgO and $BaTiO_3$ layers 23 and 24 are epitaxially arranged upon the underlying silicon substrate 22. $BaTiO_3$ is a ferroelectric oxide material which when combined with the silicon substrate 22 in the form of an overlying thin film enables the crystalline structure to take advantage of the semiconductor, as well as the optical properties, of the structure 20. As will be apparent herein, the growth (or formation) of the structure 20 predisposes the electric dipole moments of the $BaTiO_3$ film 24 in the plane of the film 24 so that the optical properties of the thin film 24 are advantageously affected and so that the structure 20 can be used in waveguide applications. Hence, the $BaTiO_3$ film 24 enables optical signals to be transmitted wherein the silicon substrate 22 can be used for transmission of electrical signals in a communication system which employs both optical and electrical signals.

As will be apparent herein, it is the influence of the in-plane thermoelastic strain that attends the ferroelectric thin film 24 which predisposes the dipole moments of the film 24 within the plane of the film 24 and advantageously effects the optical properties of the thin film 24.

Furthermore, it will be understood that the $BaTiO_3$ perovskite film is one of a number of materials having the general formula $ABO_3$, and that the silicon substrate is one of a number of a Group III, IV or II–VI materials upon which the $ABO_3$ material can be epitaxially grown for use of the $ABO_3$ material as a waveguide. For example, whereas the element A in $BaTiO_3$ (having the general formula $ABO_3$) is Ba, another material, such as the Group IVA elements Zr or Hf, can provide the element A in alternative forms of a ABO$_3$ material capable of being epitaxially grown upon the substrate in accordance with the broad principles of the present invention. A detailed discussion of the crystalline characteristics of the material having the general formula ABO$_3$ and in particular, the general series of structures designated as (AO)$_n$(A'BO)$_m$ in which n and m are the integer repeats of single plane oxide layers, and the relationship between the successively-grown layers of the ABO$_3$ and the underlying substrate can be found in the referenced co-pending application Ser. No. 08/692,343, filed Aug. 5, 1996, the disclosure of which is incorporated herein by reference.

A process used to construct the structure 20 is set forth in the combined teachings of U.S. Pat. No. 5,225,031 and co-pending application Ser. No. 08/681,880, filed Jul. 29, 1996 (each of which identifies as inventors the named inventors of the instant application), the disclosures of which are incorporated herein by reference, so that a detailed description of the construction process is not believed to be necessary. Briefly, however, and in accordance with the teachings of the referenced U.S. Pat. No. 5,225,031, the MgO film 23 is grown in a layer-by-layer fashion upon the underlying silicon substrate 22 with molecular beam epitaxy (MBE) methods and including an initial step of depositing a fraction of a monolayer (e.g. one-fourth of a monolayer) of the metal Mg atop of the silicon substrate.

Upon achieving a MgO film 23 whose thickness is about 0.2–0.3 μm (1000 to 3000 monolayers), steps are taken in accordance with the teachings of the referenced application Ser. No. 08/681,880 to construct the BaTiO$_3$ film 24 upon the underlying MgO film 23. The build-up of BaTiO$_3$ is initiated by growing a first epitaxial (preferably commensurate) single-plane layer comprised of TiO$_2$ over the surface of the MgO film 23 and then growing a second epitaxial (preferably commensurate) single-plane layer comprised of BaO over the previously-grown TiO$_2$ layer. The growth of the BaO plane is followed by the sequential steps of growing a single-plane layer of TiO$_2$ directly upon the previously-grown plane of BaO and then growing a single-plane layer of BaO upon the previously-grown layer of TiO$_2$ until a desired thickness (e.g. 0.2–0.6 μm) of the BaTiO$_3$ film 24 is obtained. Again, for a more detailed description of the growth of the MgO film 23 atop the silicon substrate 22 and the growth of the BaTiO$_3$ film 24 atop the MgO film 23, reference can be had to the referenced U.S. Pat. No. 5,225,031 and co-pending application Ser. No. 08/681,880, filed Jul. 29, 1996, the disclosures of which are incorporated herein by reference.

As will be apparent herein, since the BaTiO$_3$ film 24 is intended to serve as a waveguide for light transmitted through the structure 20, the MgO film 23 serves to optically isolate the BaTiO$_3$ film 24 from the silicon substrate 22, as well as provide a stable structure upon which the BaTiO$_3$ is grown. The index of refraction of BaTiO$_3$ is about 2.3 whereas the index of refraction of silicon is on the order of about 4.0. On the other hand, the index of refraction of MgO is about 1.74 so that by positioning the MgO film 23 between the silicon substrate 22 and the BaTiO$_3$ film 24, the amount of light which is transmitted along the BaTiO$_3$ film 24 and which could otherwise be lost into the silicon is reduced. Accordingly, the thickness of the MgO film 23 is selected to provide satisfactory optical isolation for the BaTiO$_3$ film.

During the process of constructing a structure whose composition is comparable to that of the structure 20 of FIG. 1, the ferroelectric characteristics of the structure are strongly affected by the phase transformations and the thermal contraction (i.e. the linear thermal expansion or contraction) of the materials comprising the layers of the structure. In this regard, the coefficient of thermal expansion of silicon (Si) is smaller than that of BaTiO$_3$ so that a uniform cooling of a structure comprised of a BaTiO$_3$ film-on-silicon results in the development of an appreciable in-plane strain within the unit cells of the BaTiO$_3$ film and the consequential transformation of the BaTiO$_3$ unit cells of the film to a tetragonal form as will be described herein.

Figure 3:
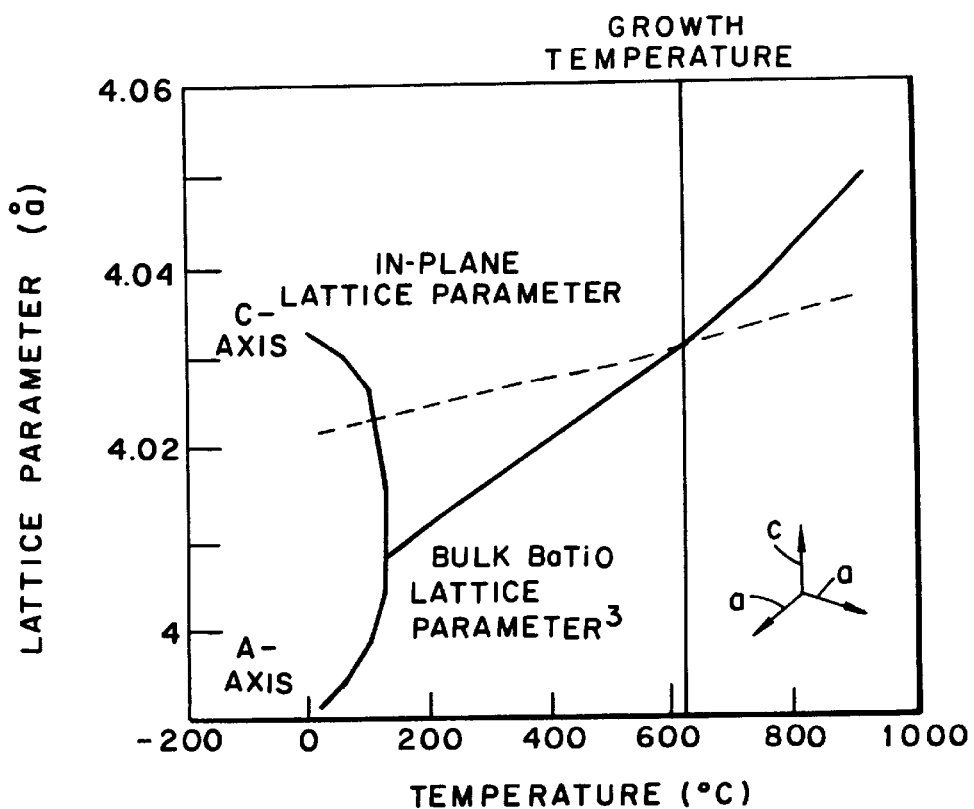
FIG. 3 is a graph of lattice parameter versus temperature for the materials $BaTiO_3$ in bulk form and $BaTiO_3$ thin films clamped to a silicon substrate.

Along the lines of the foregoing, there is shown in FIG. 3 a graph which plots the lattice parameter of the BaTiO$_3$ and silicon unit cell in a BaTiO$_3$-on-silicon structure versus temperature. It can be seen that when the BaTiO$_3$ film is grown upon the silicon at a temperature of about 600° C., the lattice parameter of the BaTiO$_3$ takes on the value that it has in bulk. However, as the structure begins to cool from the growth temperature, the in-plane lattice parameter of the thin-film BaTiO$_3$ contracts at the same rate as that of the silicon, and an in-plane strain (i.e. a change in length, $\Delta l$, divided by the original length, $l_o$) begins to develop in the BaTiO$_3$ film. It should be noted that the developed in-plane strain is uniform throughout the BaTiO$_3$ film. When the BaTiO$_3$ film transforms to the ferroelectric phase at the temperature of about 120° C., the form of the BaTiO$_3$ unit cell is changed from a cubic shape to a tetragonal, or elongated, form wherein the lattice parameter as measured along the indicated c-axis is larger than that as measured along the indicated a-axis. Furthermore, as the temperature of the structure continues to cool from 120° C., the lattice parameter as measured along the c-axis increases while the a-axis lattice parameter decreases. Meanwhile, the volume of each BaTiO$_3$ unit cell as a function of temperature is equal to the square of the cell length along the a-axis times the cell length along the c-axis (i.e. $V(T)=l_c(l_a)^2$).

It is noteworthy from the FIG. 3 graph that at about room temperature, the lattice parameter of BaTiO$_3$ as measured along the c-axis is larger than it is as measured along the a-axis. Consequently, if the BaTiO$_3$ unit cell is arranged upon the substrate so that its a-axis is oriented parallel to the surface of the substrate, the in-plane strain induced within the BaTiO$_3$ unit cell is larger than would be the case if the c-axis were oriented parallel to the substrate surface because the difference between the lattice parameter of the silicon and that of the BaTiO$_3$ crystal when measured along the a-axis is larger than it is when measured along the c-axis. However, as the BaTiO$_3$-on-structure is cooled and the BaTiO$_3$ unit cells experience a transformation in shape, the unit cells tend to naturally orient themselves so that the c-axis is parallel to the surface of the substrate and thereby maintain the in-plane strain as small as possible. It follows that the BaTiO$_3$ unit cells in the film of a BaTiO$_3$-on-silicon structure which has been cooled from the growth temperature of about 600° C. to a lower temperature of about room temperature orient themselves upon the silicon so that the longest dimension of the unit cell is arranged parallel to the plane of the silicon substrate. The orientation of the BaTiO$_3$ unit cells, which are naturally oriented so that the (longer) c-axis of the ferroelectric unit cell is parallel to the silicon substrate, also predispose the polar axes (and hence the dipole moments) of the BaTiO$_3$ unit cells in a plane which is substantially parallel to the surface of the substrate.

Although the foregoing discussion has focused upon the characteristics of BaTiO$_3$ unit cells in a BaTiO$_3$-on-silicon structure, the characteristics of BaTiO$_3$ unit cells are the same as aforedescribed when a thin film of MgO is interposed between the silicon substrate and the BaTiO$_3$ film. The thickness of the silicon substrate is so large in comparison to that of either the MgO or BaTiO$_3$ film that it is the strain of the silicon which dominates during the contraction of the overlying films, rather than vise-versa. In other words, the interposed layer of MgO is simply too thin to alter the characteristics of contraction of the BaTiO$_3$ when overlying silicon from those previously described. Consequently, in a structure like that of the structure 20 of FIGS. 1 and 2 wherein a thin film 23 of MgO is interposed between a silicon substrate 22 and a film 24 of BaTiO$_3$ and the resulting structure is cooled from the growth temperature of 600° C., the BaTiO$_3$ unit cells are arranged over the silicon substrate so that the longest dimensions thereof are oriented parallel to the plane of the silicon substrate. Consequently, the polar axes (and the dipole moments) of the BaTiO$_3$ unit cells in a structure like that of the structure 20 of FIGS. 1 and 2 are also arranged in a plane which is substantially parallel to the surface of the silicon substrate.

Electro-optic Considerations

For use of the BaTiO$_3$ film of the structure described herein in a waveguide application, such as in a phase modulator or interferometer, it is desirable that the electro-optic coefficient (designated "r" in the known Pockets Effect equation) be optimized (i.e. be as large as practically possible) to effect a greater phase shift in a beam of light directed through the BaTiO$_3$ film in response to a change in the electric field applied across the film. In this connection, it is known that the electro-optic coefficient of a single crystal waveguide is effected by such factors as the orientation of the electric field, the orientation of polarization of light directed through the material, and the orientation of the crystal (with respect to the beam directed therethrough). Of the aforementioned factors, the last-mentioned factor (i.e. the orientation of the crystal) relates to the orientation of the dipoles of the crystal.

Along the same lines, the electro-optic (EO) response (corresponding to the aforediscussed electro-optic coefficient) for a crystalline material, such as BaTiO$_3$, is described by a third rank tensor. The elements of the tensor relate the change in refractive index, Δn, for the crystalline material to the applied electric field, E, in accordance with the following equation:

$$\Delta n_m = -\frac{1}{2} n^3 \begin{bmatrix} 0 & 0 & r_{13} \\ 0 & 0 & r_{13} \\ 0 & 0 & r_{33} \\ 0 & r_{51} & 0 \\ r_{51} & 0 & 0 \\ 0 & 0 & 0 \end{bmatrix} \cdot E_n \quad (1)$$

The EO response is described by a third rank tensor because there exists three different sets of directions that can describe the EO response figure of merit, $r_{mn}$. These three sets of directions correspond to the aforementioned 1) direction of the applied electric field, 2) direction of the polarization of light directed through the material, and 3) orientation, or polar axis, of the crystal with respect to the beam directed therethrough. For a tetragonal unit cell, such as BaTiO$_3$ of the aforedescribed (cooled) BaTiO$_3$-on-silicon structure, there are three orthogonal directions, n, in which the electric field can be oriented. More specifically, n=1 is in the "x" direction, n=2 is in the "y" direction, and n=3 is in the "z" direction. Electric fields which are applied in other directions are just superpositions of these three x, y and z orthogonal directions.

For this same crystal type (a tetragonal unit cell), there are four distinct directions along which light can be polarized. They are, as for the electric field directions, the x, y and z directions having a subscript m of 1, 2 and 3. The other two come from the fact that the unit cell can be polarized up or down the c-axis of the unit cell. The two optical polarizations have equal components along the y and z directions and are assigned the subscripts m=5 and 4. As can be seen in the third rank tensor for BaTiO$_3$ (the matrix appearing between the brackets in Equation (1) above), the largest EO response is achieved when the polarization is along the x-z direction and a component of the electric field is in the x direction, $r_{51}$.

To take advantage of the large $r_{51}$ in the thin film waveguide structures, the directions of the fields have to be oriented in a prescribed manner relative to the ferroelectric domains that form in the thin film structure. The domains that form in the BaTiO$_3$ unit cells of the aforedescribed BaTiO$_3$-on-silicon structure are determined by the aforediscussed differences in thermal expansion (or contraction) between BaTiO$_3$ and silicon. The polar axis of the particular domain structure that forms in the BaTiO$_3$ can be oriented in any of four directions (corresponding to directions along either of the x or y coordinates), but these polar axes are all arranged parallel to the plane of the silicon substrate due to the thermal strain influences on the cubic-tetragonal phase transformation of the BaTiO$_3$ on silicon.

Figure 4:
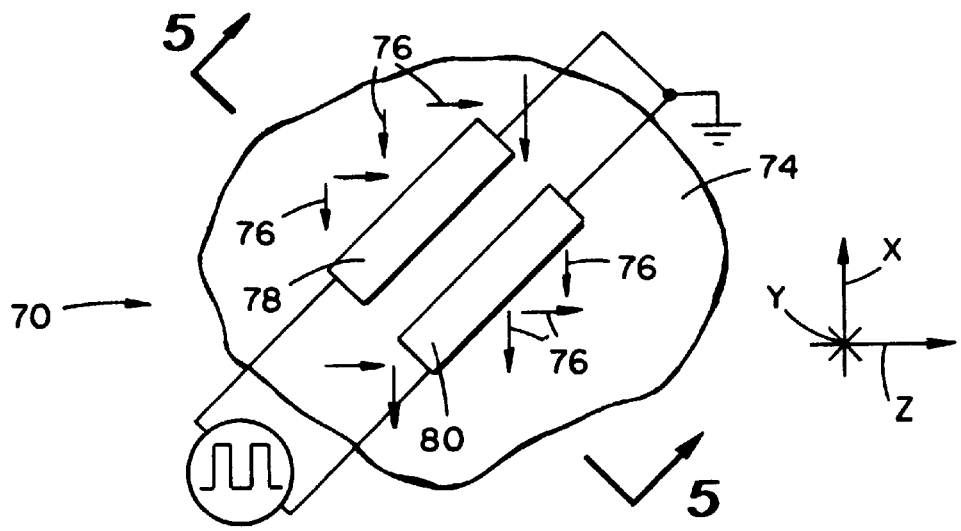
FIG. 4 is a plan view of an electro-optic device within which features of the present invention are embodied.
Figure 5:
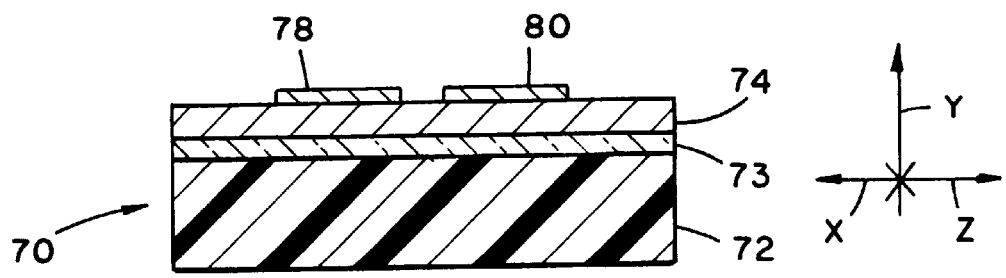
FIG. 5 is a cross-sectional view taken about along line 5—5 of FIG. 4.

A BaTiO$_3$-on-silicon device which achieves practical realization of the optimum EO and the electro-optic coefficient is shown in FIGS. 4 and 5 and indicated 70. The device 70 includes a substrate 72 of silicon, and intermediate thin film layer 73 of magnesium oxide (MgO) and a thin film layer 74 of the perovskite BaTiO$_3$ overlying the MgO layer 23. In the device 70, the orientation (and exemplary directions) of the polar axes of the plane of the BaTiO$_3$ film are indicated with the arrows 76, the light directed through the BaTiO$_3$ film 74 is directed therethrough along the indicated "x-z" direction and is polarized in-plane. An electric field is applied between electrodes 78 and 80 positioned across the film 74, and the applied electric field is arranged at about a 90° angle with respect to the direction of light directed through the BaTiO$_3$ film and at about a 45° angle with respect to the orientations of the polar axes of the BaTiO$_3$ unit cells. The mode of propagation in the device 70 is allowed and is called a transverse electric mode.

It is noteworthy to point out that arbitrary polarizations of the BaTiO$_3$ unit cells of the film 74 cannot be supported by a thin-film waveguide structure. The polarization must either be in the plane of the film or (mostly) out of the plane. Because of this limitation, the in-plane poling induced by the thermal expansion misfit is the optimum poling that provides access to the large $r_{51}$ coefficient of BaTiO$_3$.

It follows from the foregoing that a BaTiO$_3$-on-Si structure has been described which has beneficial optical qualities. While BaTiO$_3$, itself, is known to provide a waveguide structure, its utilization as a waveguide structure when built upon a silicon wafer (or any other substrate) has not heretofore been realized. Once constructed, the resultant BaTiO$_3$-on-Si structure can be used as a phase modulator wherein the BaTiO$_3$ film serves as the waveguide through which a beam of light is transmitted and across which an electric field is applied (and appropriately controlled) for the purpose of altering the phase of the light beam transmitted through the BaTiO$_3$ film. By utilizing the same phase modulator in one branch of an interferometer, the phase modulator can function as an intensity modulator.

It will be understood that numerous modifications and substitutions can be had to the aforedescribed embodiment without departing from the spirit of the invention. For example, arrangements within devices other than that of FIGS. 4 and 5 can be fabricated to optimize coupling of the electric field to the ferroelectric film as well as match the microwave coupling of the electric field to the ferroelectric film as well as match the microwave phase velocity traveling along the electrodes with the speed of the guided light.

Still further, although the $BaTiO_3$-on-Si structure has been described above as including an intermediate layer of MgO having a thickness which is sufficient to optically isolate the $BaTiO_3$ from the underlying silicon substrate, it may be desirable for some applications that the intermediate MgO layer be thin enough to permit some amount of the transmitted light to be lost into the silicon substrate. In other words, the thickness of the intermediate MgO should be considered as a design parameter chosen with regard to the application in which the structure is to be used.

Further still, although foregoing exemplary structures have been described as including $BaTiO_3$ in a pure form, the principles of this invention are intended to cover applications wherein the ferroelectric perovskite, such as $BaTiO_3$, has been doped with a material, such as Erbium, thereby enabling the perovskite to amplify light transmitted therethrough due to the optic interactions of transmitted light with the doping material. Of course, a light amplifier of such construction may find application as a gain component of an electro-optic system (which gain component can compensate for loss of light transmitted around a bend) or even a laser. Such a laser device includes 1) a channel waveguide of low loss, 2) mirrors on both ends, or gratings, to form a laser cavity, 3) a pump light source or, alternatively, an electrical pumping system consisting of other dopants that act as reservoirs of electrons and couple to the lasing levels, and 4) electrodes, as in a phase modulator, to vary the index of refraction within the laser cavity and perform a tuning function. While these (four) laser features have been proposed in the art, our contribution here permits the integration of such a laser on silicon.

Further still, the thickness of the light-guiding layer in a structure of this invention can be selected for transmitting different modes of light which may, for example, enable the transmission of several types of signals by the same light-guiding structure. Alternatively, the materials of the light-guiding structure render possible the construction of a structure wherein the optimizing of a structure to provide a single mode guide or a multiple mode (i.e. multiplex) guide.

Accordingly, the aforedescribed embodiments are intended for the purpose of illustration and not as limitation.

What is claimed is:

1. A component for a communication system comprising:
   a semiconductor substrate having a surface;
   a ferroelectric, optically-clear thin film overlying the surface of the substrate wherein substantially all of the dipole moments associated with the ferroelectric film are arranged substantially parallel to the surface of the substrate.

2. A crystalline structure comprising:
   a semiconductor substrate having a surface;
   a ferroelectric, optically-clear thin film overlying the surface of the substrate wherein at least the first few atomic layers of the thin film are commensurate with the semiconductor substrate and so that substantially all of the dipole moments associated with the ferroelectric film are arranged substantially parallel to the surface of the substrate to enhance the electro-optic qualities of the structure.

3. The structure as defined in claim 2 wherein there is interposed between the semiconductor substrate and the ferroelectric thin film an intermediate thin film which provides an optical isolation layer between the substrate and the ferroelectric thin film.

4. The structure as defined in claim 2 wherein the semiconductor substrate includes silicon and the ferroelectric thin film includes a perovskite of the $BaTiO_3$ class of perovskites.

5. The structure as defined in claim 4 further including a thin film layer of MgO interposed between the silicon substrate and the thin film of perovskite.

6. The structure as defined in claim 2 wherein the ferroelectric thin film of the structure is used as a waveguide.

7. The structure as defined in claim 1 wherein the ferroelectric thin film is doped with an element which alters the optical properties of the thin film.

8. A crystalline structure comprising:
   a semiconductor substrate having a surface;
   a ferroelectric thin film overlying the surface of the substrate wherein the ferroelectric thin film consists of an $ABO_3$ material having at least one AO constituent plane and at least one $BO_2$ constituent plane and wherein the thin film is arranged upon the surface of the substrate so that a first single plane consisting of a single atomic layer of said AO constituent of the $ABO_3$ material overlies the surface of the substrate and a second single plane consisting of a single plane consisting of a single atomic layer of said $BO_2$ constituent of the $ABO_3$ material overlies the first single plane of AO; and
   wherein substantially all of the dipole moments associated with the ferroelectric film are arranged in a predisposed orientation with respect to the surface of the substrate.

9. The structure as defined in claim 8 wherein the dipole moments of substantially all of the unit cells of the ferroelectric material are oriented substantially parallel to the surface of the substrate.

10. The structure as defined in claim 8 wherein the semiconductor substrate includes silicon and the ferroelectric thin film includes a perovskite of the $BaTiO_3$ class of perovskites.

11. The structure as defined in claim 10 further including a thin film layer of MgO interposed between the silicon substrate and the thin film of perovskite.

12. The structure as defined in claim 11 wherein the ferroelectric thin film of the structure is used as a waveguide.

13. The structure as defined in claim 7 wherein the material of the ferroelectric film is selected for its lattice parameter in comparison to the lattice structure of the underlying substrate so that when built upon the underlying substrate, the unit cells of the film are influenced by the in-plane strain induced therein so that the dipole moments are arranged in a predisposed orientation with respect to the surface of the substrate.

14. The structure as defined in claim 8 wherein the ferroelectric thin film is doped with an element which alters the optical properties of the thin film.

15. The structure as defined in claim 14 wherein the doping element is Erbium to impart optical amplification qualities to the thin film.

* * * * *